United States Patent [19]

Thornton et al.

[11] Patent Number: 5,439,575
[45] Date of Patent: Aug. 8, 1995

[54] HYBRID METHOD FOR DEPOSITING SEMI-CONDUCTIVE MATERIALS

[75] Inventors: John A. Thornton, deceased, late of Champaign, Ill., by Joy Crane Thornton, legal representative; Timothy Lommasson, Champaign, Ill.; Angus Rockett, Champaign, Ill.

[73] Assignee: Board of Trustees of the University of Illinois, Champaign, Ill.

[21] Appl. No.: 213,698

[22] Filed: Jun. 30, 1988

[51] Int. Cl.⁶ .............................................. C23C 14/34
[52] U.S. Cl. ................... 204/192.25; 148/33; 136/265; 204/192.15; 204/298.26
[58] Field of Search ............ 204/192.12, 192.25, 204/192.3, 298.18, 298.26, 192.15; 136/260, 265; 148/33

[56] References Cited

U.S. PATENT DOCUMENTS 4,465,575  8/1984  Love et al. ................. 204/192.26
4,596,645  6/1986  Stirn ............................ 204/192.25

Primary Examiner—Aaron Weisstuch
Attorney, Agent, or Firm—Flehr, Hohbach, Test, Albritton & Herbert

[57] ABSTRACT

The invention provides a method and apparatus for depositing alloy films useful in manufacturing photovoltaic solar cells. In the preferred embodiment an alloy comprising copper, indium, and selenium is deposited on a substrate. Sputtering is utilized to provide the copper and indium, with the selenium being provided by evaporization. Other alloys may also be formed using the disclosed apparatus and techniques.

12 Claims, 4 Drawing Sheets

HYBRID METHOD FOR DEPOSITING SEMI-CONDUCTIVE MATERIALS

BACKGROUND OF THE INVENTION

1. Field of the Invention

The invention relates to depositing alloys and more specifically to improved methods for depositing alloys of copper, indium, and selenium.

2. Summary of the Prior Art

Various processes have been utilized in the prior art to form semiconductor materials of copper, indium, and selenium. All of these processes included limitations which prevented them from being easily scaled to produce very large wafers of the type desired for photovoltaic solar cells.

SUMMARY OF THE INVENTION

The preferred embodiment of the invention comprises a hybrid sputter-evaporation process and apparatus for depositing alloys of metals and metalloids. The process utilizes sputtering to deposit selected constituents of a selected alloy Evaporation is utilized to deposit the remaining constituent of the alloy. The sputtering technique could include magnetron sputtering, triode sputtering, radio frequency diode sputtering, or like techniques.

In the preferred embodiment of the process, selenium (or other elements having suitable vapor pressure) is deposited by an evaporation process while the copper and indium (or alloying metals having suitable vapor pressure) are deposited using magnetron sputtering. Because of the independent control over the copper and indium sputtering sources, two layer depositions with graded copper and indium compositions can be deposited. More complex alloys could be deposited by the same process from alloyed targets using one or more magnetrons.

In addition to deposition of copper indium diselenide advanced alloys, for example copper indium gallium diselenide may be deposited by the hybrid sputter evaporation process for applications requiring specifically tuned band gaps. The above alloy could be deposited from two targets, one consisting of indium, the second consisting of an appropriate copper galium alloy. Other alloys could be similarly produced.

Additionally, low energy bombardment of the deposited material can be utilized, as appropriate to improve the physical properties of these deposited alloys. The ion-assisted hybrid deposition process is practical with modest energy and momentum transfer to the growing surface.

The ion bombardment is beneficial in suppressing columnar or low density structures. Additionally, the grain size of the deposited material (alloy) may be significantly increased. Ion bombardment also typically permits the temperature of the substrate to be decreased.

Semiconductor materials having compositions ranging from copper rich to indium rich have been formed by the hybrid process. In all cases, the material showed a (112) preferred orientation. Optical absorption changes were observed for all compositions at approximately 1 eV, corresponding to the accepted $CuInSe_2$ band gap. Resistivities ranged from 100 ohm-cm for indium rich materials to 0.01 ohm-cm for copper rich films.

The grain structure varies with the composition of the material. The grain size range was 50 to 100 nm for indium rich films and 200 to 400 nm for copper rich films.

In all sputtering deposition processes, it is necessary to maintain the various fluxes of the alloy being deposited in an inert atmosphere and control the temperature and pressure inside the deposition apparatus. In the preferred embodiment of the invention these functions can be provided using prior art techniques. However, the preferred inert atmosphere is believed to be argon gas. Cost permitting, krypton could be used. Certain advantages could be expected to accrue using krypton. In the preferred embodiment of the process the deposition pressure is in the range of 0.01 to 100 milli Torr and temperatures in the range 0 to 600 degrees Celsius.

The hybrid process and apparatus which is the subject matter of this patent application meets all the requirements for high volume production of semiconductor films in that the process and apparatus can be scaled up to produce a large volume and size films. Process parameters are easily controlled using well known control techniques to produce the desired ratio of the constituents of the alloy. Additionally, the hybrid process is safer than some prior art processes for forming similar semiconductor materials because it does not require the use of hydrogen selenide, which is extremely toxic.

The process was developed to form copper, indium, selenium alloys for use as semiconductor coatings for photovoltaic solar cells. The process is based on the principle that in both three source evaporation and reactive sputtering, at least to a first order, the copper and indium fluxes are the critical variables in controlling the final properties of the material in that the selenium must simply be maintained in a supersaturated flux over the deposition surface.

Additionally, the selenium fluxes are typically two to three times larger than the combined copper and indium fluxes. Excess selenium is thermally rejected. From a control standpoint, it is only necessary to assure that the selenium flux is adequate. Additionally, the low melting point of selenium (217 degrees Celsius) makes it possible to design a long slit type evaporation source capable of providing a uniform selenium flux over wide deposition areas which are believed to be required for large scale production semiconductor layers for use in constructing photovoltaic solar cells.

It is important to note that the sputtering rate from a magnetron sputtering source is essentially proportional to the discharge current since the sputtering voltages are essentially constant. This is in contrast to the evaporation case where, as noted, the evaporation rate depends in a complex way on the power delivered to the source crucible. In production, based on existing technology, it is clear that practical magnetron sputtering sources will meet the copper and indium source material storage requirements for five days of continuous operation. This is an important feature for large scale production.

In summary, the disclosed process offers the following advantages for large scale production.

1. No requirement for using hydrogen selenide or other dangerous materials.
2. Uniform deposition over large working areas.
3. Linear control over the deposition rate of the materials supplied by sputtering.
4. Storage of large inventory of coating materials.

5. Capability of depositing coating with graded copper indium compositions.
6. Capability of depositing alloy coating and adaptability for ion-assisted depositions.

The disclosed process may be practiced using a single sputtering source. Sputtering targets including more than one element may be used. In such a case, the alloy layer deposited will reflect the target materials (elements) and reflects the ratio that these materials are included in the target.

DETAILED DESCRIPTION

Figure 1:
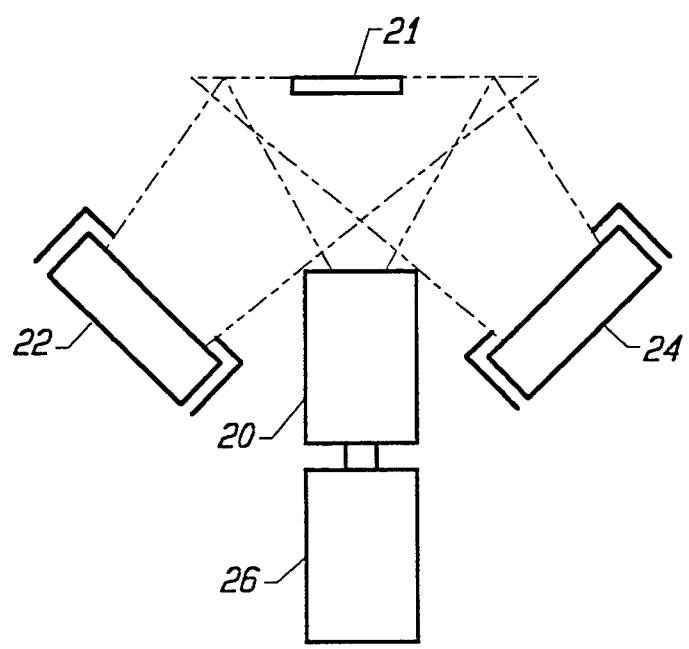
FIG. 1 is a schematic diagram of the deposition process comprising the invention.

FIG. 1 is a somewhat schematic diagram illustrating the hybrid process for depositing an alloy comprising three materials. Material is utilized to indicate that the sputtering targets may include more than one element. More specifically, in the preferred embodiment of the invention, copper and indium are sputter deposited onto a substrate 21 from conventional magnetron sputtering sources 22 and 24. Selenium is simultaneously evaporated in an evaporator 26 and transported through a transport tube 20 to the substrate 21. Fluxes from the sputtering source 22 and 24 and the evaporator 26 mix inside a common deposition chamber and are deposited on the substrate 21.

As in all sputtering processes, the deposition chamber is filled with a sputtering gas, such as argon or krypton. Collisions occur between the selenium atoms and the atoms of the sputtering gas as the selenium atoms travel from the selenium source to the substrate. Scattering as a result of these collisions decreases the deposition efficiency.

Figure 4:
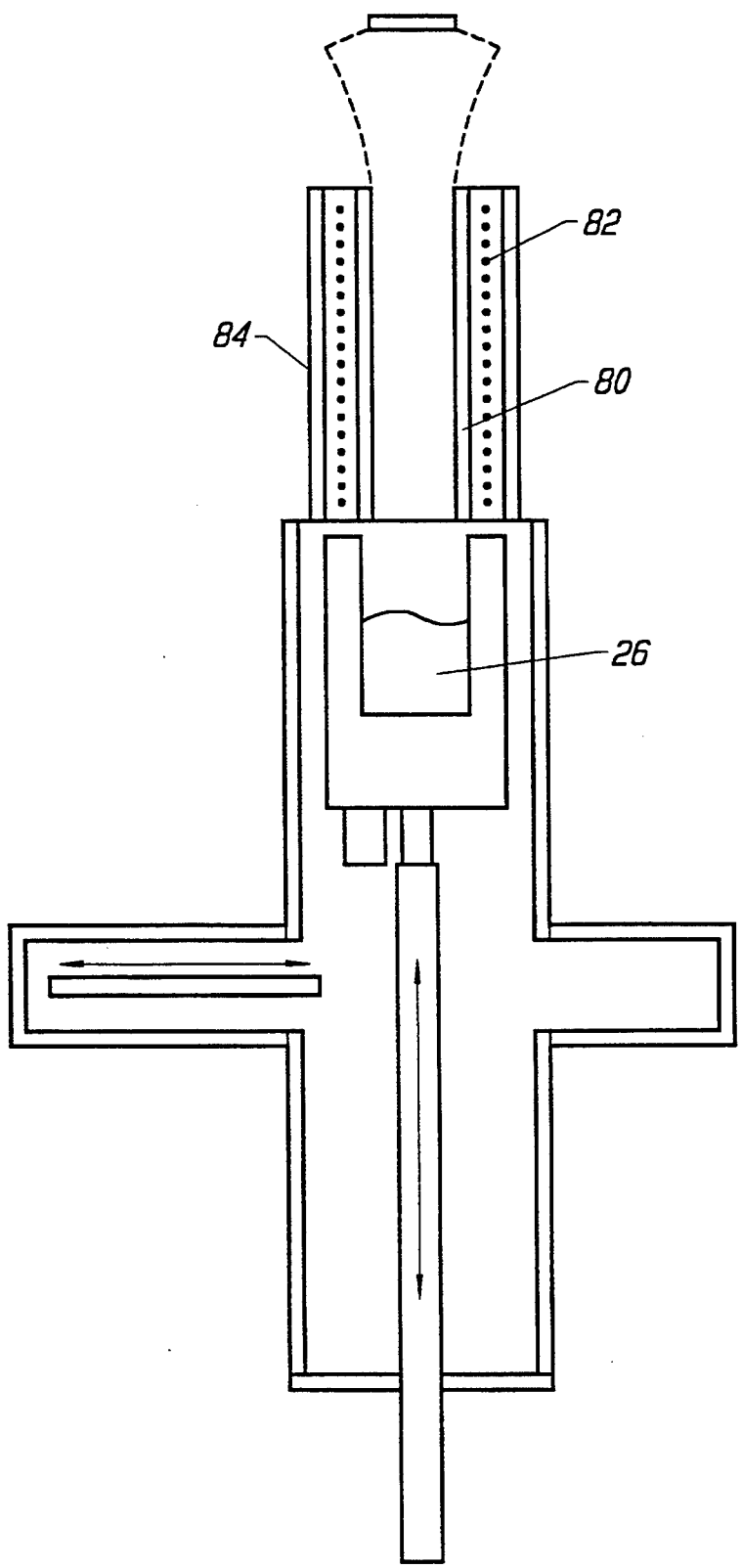
FIG. 4 is a drawing illustrating features of the transport tube mechanism.

Deposition efficiency is increased by either placing the selenium source close to the substrate or by using a transport tube, as illustrated in FIG. 4. Additionally, the use of the transport tube reduces selenium contamination of the copper and indium sources by reducing the selenium flux in the areas near these sources. Reducing contamination improves controllability of the process because contamination of the copper and indium sources may reduce vaporization efficiency.

As previously explained, the rate at which the copper and indium combine and deposit on the substrate is determined by the magnitude of these fluxes in the vicinity of the substrate. By contrast, the selenium flux from the vaporizer 26 is maintained in a super-saturated state over the growing film with excess selenium being thermally rejected.

Figure 2:
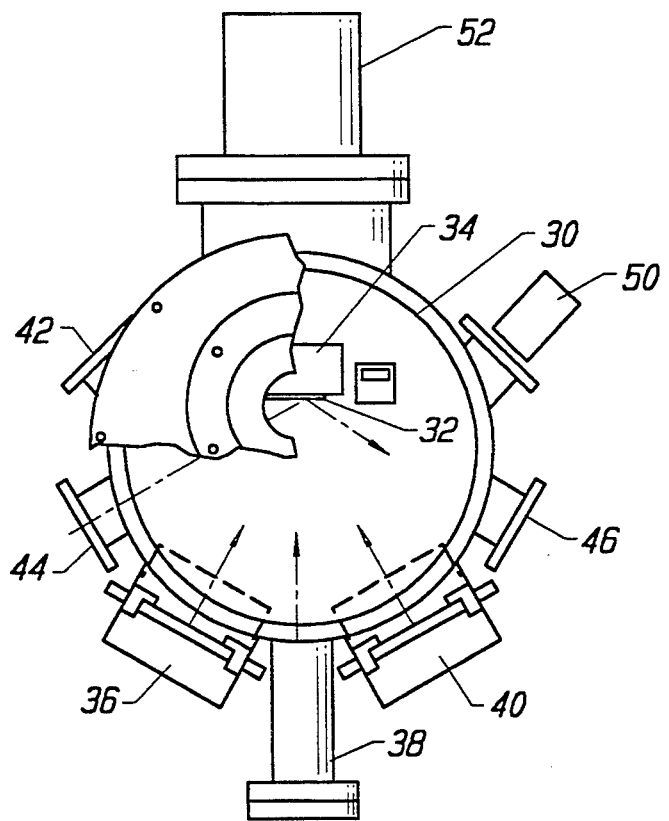
FIG. 2 is a drawing illustrating the apparatus utilized in practicing the invention.

FIG. 2 illustrates the deposition apparatus in more detail. More specifically, the deposition apparatus includes an outer vessel 30. The substrate 32 on which the deposition occurs, is affixed, using any suitable means to a substrate heater 34 which is controlled to maintain the substrate 32 at the desired temperature. The copper sputtering source, the selenium evaporation source, and the indium sputtering source are respectively illustrated at reference numerals 36, 38, and 40. Various ports are provided around the periphery of the vessel 30.

More specifically, a source viewport 42 permits the various sources to be visually inspected to determine that they are operating properly. A substrate characterization port 44 permits the characteristics of the substrate to be monitored. Visual inspection of the substrate 32 is provided by a substrate view port 46. An optical spectrometer 50 permits real time monitoring of the environment internal to the deposition chamber. Similarly, monitoring of the various fluxes inside the deposition chamber is made by a mass spectrometer 52.

Figure 3:
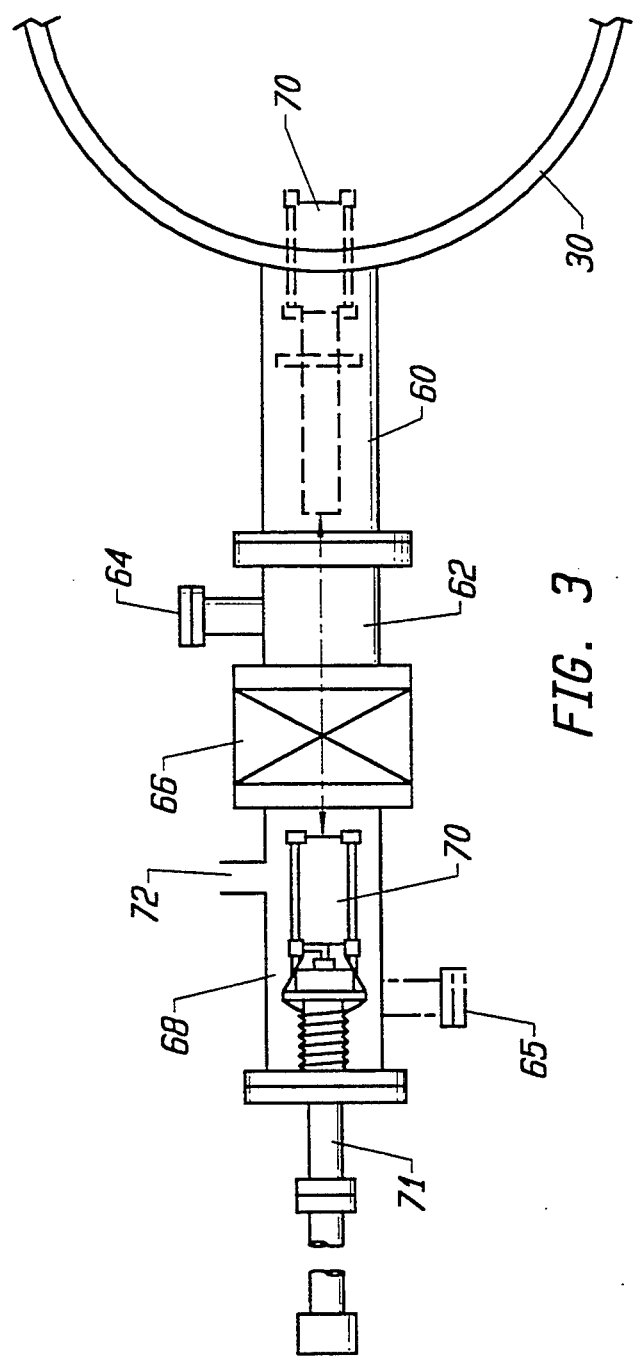
FIG. 3 is a drawing of the apparatus used to load the selenium source.

FIG. 3 is a drawing illustrating the mechanism permitting the selenium source to be changed without contaminating the interior of the deposition chamber. A circular port structure 60 extends through the outer wall 30 of the deposition chamber. A coupling section 62 is mounted to the port 60. Electrical pass-through structure 65 provides convenient means for coupling the electrical energy to the evaporation source required for evaporating the selenium. Electrical pass-through port 64 provides means for coupling electrical energy to the ionizer to ionize the selenium, if required.

A gate valve 66 is mounted on the second end of the coupling section 62. A load lock mechanism 68 is coupled to the second end of the gate valve 66.

In operation, the selenium source 70 is positioned within the load-lock using any convenient means. The load-lock is evacuated through a pump port 72. After evacuation, the gate valve 66 is opened and the high vacuum manipulator arm 71 is operated to position the selenium source 70 in the operating position as shown in dotted lines.

FIG. 4 illustrates the use of a transport tube 80 to transfer the evaporated selenium from the evaporation source 26 to a point interior to the deposition chamber. More specifically, the selenium evaporation source is positioned such that the evaporated selenium travels into the interior of a quartz tube 80. Surrounding the quartz tube 80 is an electrically operated heater 82. The quartz tube 80 and the heater 82 are supported by a suitable co-axial outer structure 84. The heater 82 is controlled to maintain the quartz tube 80 at a temperature which prevents depositing selenium on its interior surface.

Figure 5:
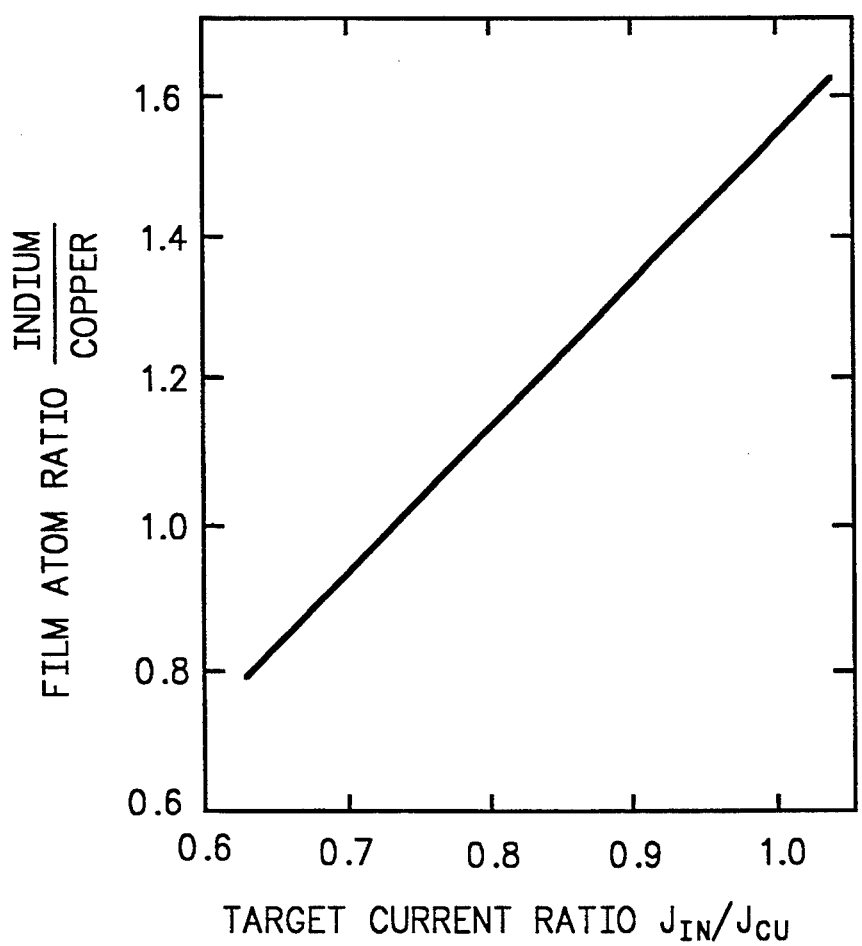
FIG. 5 is a graph showing the linear relationship between the ratio of the sputtering currents and the ratio of the deposition rate of the sputtered materials.

FIG. 5 is a graph illustrating the linear relationship between the sputtering target currents and the concentration of the materials contained in the targets in the deposited film. More specifically, FIG. 5 illustrates the ratio of the number of atoms of indium to the number of atoms of copper in the deposited film with respect to the ratio of sputtering target currents for these elements. Experimental results have also demonstrated that this linear ratio is maintained even though the temperature of the substrate is changed.

In operation, the current to the copper and indium magnetron sputtering sources 22 and 24, illustrated in FIG. 1, are controlled to produce the desired copper and indium fluxes at the surface of the substrate 32. Electric power to the selenium evaporator 26 is controlled to produce a supersaturated selenium flux at the surface of the substrate 32. The ratio of incorporated copper and indium are determined by the ratios of the flux produced by the respective sputtering sources. Excess selenium is thermally rejected.

Ionizing apparatus may be included in the selenium transport tube or just above the substrate and may be utilized to ionize either the sputtering gas or the selenium to facilitate ion bombardment of the substrate.

It is claimed:

1. A process of depositing an alloy on a substrate, said process comprising the steps of:
   positioning a substrate in a deposition chamber;
   independently controlling a first sputtering source to establish a first flux of copper in said deposition chamber;
   independently regulating a second sputtering source to establish a second flux of indium in said deposition chamber; and
   providing an evaporation source to establish a supersaturated flux of selenium in said deposition chamber, said supersaturated flux of selenium being two to three times larger than the combination of said first flux of copper and said second flux of indium; said first flux of copper, said second flux of indium, and said supersaturated flux of selenium producing an alloy layer on said substrate with predetermined quantities of copper, indium, and selenium.

2. The process of claim 1 further comprising the step of thermally rejecting selenium in said deposition chamber that is in excess of said supersaturated flux of selenium.

3. The process of claim 1 wherein said controlling step is used to independently control said first sputtering source to establish said first flux of copper in said deposition chamber such that said alloy layer on said substrate is copper rich with a resistivity of approximately 0.01 ohm-cm and a grain size of approximately 200–400 nm.

4. The process of claim 1 wherein said regulating step is used to independently control said second sputtering source to establish said second flux of indium in said deposition chamber such that said alloy layer on said substrate is indium rich with a resistivity of approximately 100 ohm-cm and a grain size of approximately 50–100 nm.

5. A product formed by the process of claim 1.

6. The product of claim 5 wherein said alloy layer is copper rich.

7. The product of claim 6 wherein said alloy layer has a resistivity of approximately 0.01 ohm-cm.

8. The product of claim 6 wherein said alloy layer has a grain size of 200–400 nm.

9. The product of claim 5 wherein said alloy layer is indium rich.

10. The product of claim 9 wherein said alloy layer has a resistivity of approximately 100 ohm-cm.

11. The product of claim 9 wherein said alloy layer has a grain size of approximately 50–100 nm.

12. The product of claim 5 wherein said alloy layer has a (112) preferred orientation.

* * * * *